(12) United States Patent
Haraguchi et al.

(10) Patent No.: US 9,788,441 B2
(45) Date of Patent: Oct. 10, 2017

(54) SWITCHING DEVICE (71) Applicants: Sumitomo Wiring Systems, Ltd., Yokkaichi, Mie (JP); AutoNetworks Technologies, Ltd., Yokkaichi, Mie (JP); Sumitomo Electric Industries, Ltd., Chuo-ku, Osaka-Shi, Osaka (JP)

(72) Inventors: Akira Haraguchi, Mie (JP); Manabu Hashikura, Mie (JP); Hideo Morikoka, Mie (JP); Hideaki Tahara, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 15/113,653

(22) PCT Filed: Jan. 9, 2015

(86) PCT No.: PCT/JP2015/050456
§ 371 (c)(1),
(2) Date: Jul. 22, 2016

(87) PCT Pub. No.: WO2015/111447
PCT Pub. Date: Jul. 30, 2015

(65) Prior Publication Data
US 2017/0006718 A1  Jan. 5, 2017

(30) Foreign Application Priority Data

Jan. 22, 2014  (JP) ................................ 2014-009721

(51) Int. Cl.
*H05K 5/02* (2006.01)
*H05K 5/00* (2006.01)
(Continued)

(52) U.S. Cl.
CPC ....... *H05K 5/0217* (2013.01); *B60R 16/0238* (2013.01); *H02G 3/16* (2013.01); *H05K 5/0017* (2013.01)

(58) Field of Classification Search
CPC . H05K 5/0026–5/0052; B60R 16/0238; B60R 16/0239; B60R 16/03; H02G 3/08; H02G 3/22; H02G 5/00; H02G 5/007
See application file for complete search history.

(56) References Cited

U.S. PATENT DOCUMENTS 6,078,501 A * 6/2000 Catrambone ......... H02M 7/003
                                                                  174/50
6,350,949 B1 * 2/2002 Boyd ..................... H05K 7/026
                                                                  174/17.05
(Continued)

FOREIGN PATENT DOCUMENTS

DE  102004052476 A1  6/2005
DE  102008046532 A1  4/2009
(Continued)

OTHER PUBLICATIONS

European Search Report for PCT/JP2015050456, dated Jan. 17, 2017, 7pp.

*Primary Examiner* — Hoa C Nguyen
(74) *Attorney, Agent, or Firm* — Dinsmore & Shohl LLP (57) ABSTRACT

A switching device includes a switching board with busbars, an upper case and stud bolts and nuts for fixing fastening terminals connected to wiring harnesses to the busbars. The upper case includes guide walls for guiding movements of the fastening terminals to fastening positions, and the restriction walls for restricting the rotation of the fastening terminals. The restriction walls are arranged to prevent a
(Continued)

contact of the fastening terminal when the fastening terminal is rotated until the wiring harness comes into contact with the restriction wall.

2 Claims, 11 Drawing Sheets

(51) Int. Cl.
*H02G 3/16* (2006.01)
*B60R 16/023* (2006.01)

(56) References Cited

U.S. PATENT DOCUMENTS

2009/0053588 A1* 2/2009 Marukawa .......... H01M 2/1072
429/97
2009/0068894 A1 3/2009 Ohashi et al.

FOREIGN PATENT DOCUMENTS

| DE | 102009047961 A1 | 4/2010 |
| JP | 08264102 A | 10/1996 |
| JP | 2009070653 A | 3/2000 |
| JP | 2004055886 A | 2/2004 |
| JP | 2009146933 A | 7/2009 |
| JP | 2012253910 A | 12/2012 |
| WO | 2012120805 A1 | 9/2012 |

* cited by examiner

SWITCHING DEVICE

CROSS-REFERENCE TO RELATED APPLICATIONS

This application is the U.S. national stage of PCT/JP2015/050456 filed Jan. 9, 2015, which claims priority of Japanese Patent Application 2014-009721 filed Jan. 22, 2014.

FIELD OF THE INVENTION

The present invention relates to a switching device.

BACKGROUND OF THE INVENTION

In recent years, automotive vehicles mounted with an auxiliary power supply besides a main battery have been developed for fuel economy improvement and consideration to environments. For example, the amount of power generation by an alternator can be reduced and fuel economy can be improved by accumulating regenerative energy during braking in the auxiliary power supply and using the accumulated energy for the supply of power to electric components during travel. Further, the instantaneous disconnection of the electric components due to an instantaneous voltage drop of the main battery and the deterioration of the main battery can be prevented by supplying power to a starter from the auxiliary power supply when an engine is restarted after an idling stop.

A switching board having a function of switching a power supply mode in correspondence with an operating state of a vehicle such as traveling and an idling stop is disposed between the main battery and the auxiliary power supply in some cases. A switching board used includes a busbar, a switching element mounted on the busbar and a control circuit board (see patent literature 1).

Since a large current flows, a wiring harness having a large outer diameter needs to be used for connection between the switching board and a main battery, an auxiliary battery. It is generally known to connect a wiring harness and a switching board by fixing a fastening terminal connected to one end of the wiring harness to a busbar using a bolt and a nut.

At the time of a fastening operation, after the nut is held by a tool such as an impact wrench, the tool is moved to a fastening position, is positioned with respect to the bolt and fastens the nut. At this time, to avoid the rotation of the fastening terminal according to the rotation of the nut, the fastening operation is normally performed while the fastening terminal is pressed with a tool such as a pair of pliers.

On the other hand, an engine compartment of an automotive vehicle where the switching board is arranged is a narrow space and an operation space is restricted. In such an operational environment, there are problems such as difficulty in aligning the tool for fastening the nut with the fastening position and difficulty in ensuring a clearance for the insertion of the tool for pressing the fastening terminal.

The present invention was completed based on the above situation and aims to provide a switching device capable of improving operability in fixing a fastening terminal.

SUMMARY

The present invention is a directed to a switching device with a switching board including a circuit constituent having a control circuit board and a busbar arranged on one surface of the control circuit board and a switching element mounted on the circuit constituent, a case member arranged to be placed on the surface of the switching board where the busbar is arranged, a bolt arranged to penetrate through the busbar and the case member, and a nut for fixing a fastening terminal connected to one end part of a wire to the busbar by being threadably engaged with the bolt, wherein the case member includes a guide wall arranged around the bolt and configured to guide a movement of a tool for fastening the nut to the bolt to a fastening position to the bolt and a restriction wall connected to the guide wall and configured to restrict the rotation of the fastening terminal by coming into contact with the wire, and the restriction wall is arranged to prevent a contact of the fastening terminal when the fastening terminal is rotated until the wire comes into contact with the restriction wall.

According to the above configuration, the guide wall guides a tool, holding the nut, in arranging the tool at the fastening position to the bolt. Further, even if the nut is dropped from the tool, the nut stays in a space surrounded by the guide wall and the restriction wall, wherefore a loss of the nut is avoided.

Further, when the fastening terminal is rotated according to the rotation of the nut, the wire comes into contact with the restriction wall to restrict any further rotation of the fastening terminal. Thus, an operation of pressing the fastening terminal with a tool such as a pair of pliers is not necessary in performing a fastening operation.

For these reasons, operability in fixing the fastening terminal can be improved.

Furthermore, a length of the restriction wall is set to prevent the contact of the fastening terminal when the fastening terminal is rotated until the wire comes into contact with the restriction wall. That is, when the fastening terminal is rotated according to the rotation of the nut, the wire comes into contact with the restriction wall earlier than the fastening terminal to restrict any further rotation of the fastening terminal. Thus, the damage of the fastening terminal due to the contact with the restriction wall can be avoided.

The following mode is preferable as an embodiment of the present invention.

The guide wall may be a wall having a semicircular cross-section, a pair of the restriction walls may be respectively connected to opposite end edges of the semicircular guide wall, the pair of restriction walls may be arranged in parallel to each other and a distance between the pair of restriction walls may be equal to a length of a line connecting opposite ends of the semicircular guide wall, and a length of the restriction wall defined by a distance from an end edge of the restriction wall connected to the guide wall to an opposite end edge may be set such that the fastening terminal does not contact the restriction wall when being rotated until the wire comes into contact with the restriction wall.

According to the above configuration, a sufficient distance is ensured between the pair of restriction walls in a range where the rotation of the fastening terminal can be suppressed. That is, a sufficient space is ensured to arrange the wire in the space surrounded by the guide wall and the pair of restriction walls. In this way, operability in fixing the fastening terminal can be improved.

According to the present invention, it is possible to provide a switching device capable of improving operability in fixing a fastening terminal.

DETAILED DESCRIPTION

An embodiment of the present invention is described with reference to FIGS. 1 to 11.

A switching device 1 of this embodiment switches the supply of power to electric components from a main battery and an auxiliary battery in a vehicle provided with the main battery and the auxiliary battery.

Figure 1:
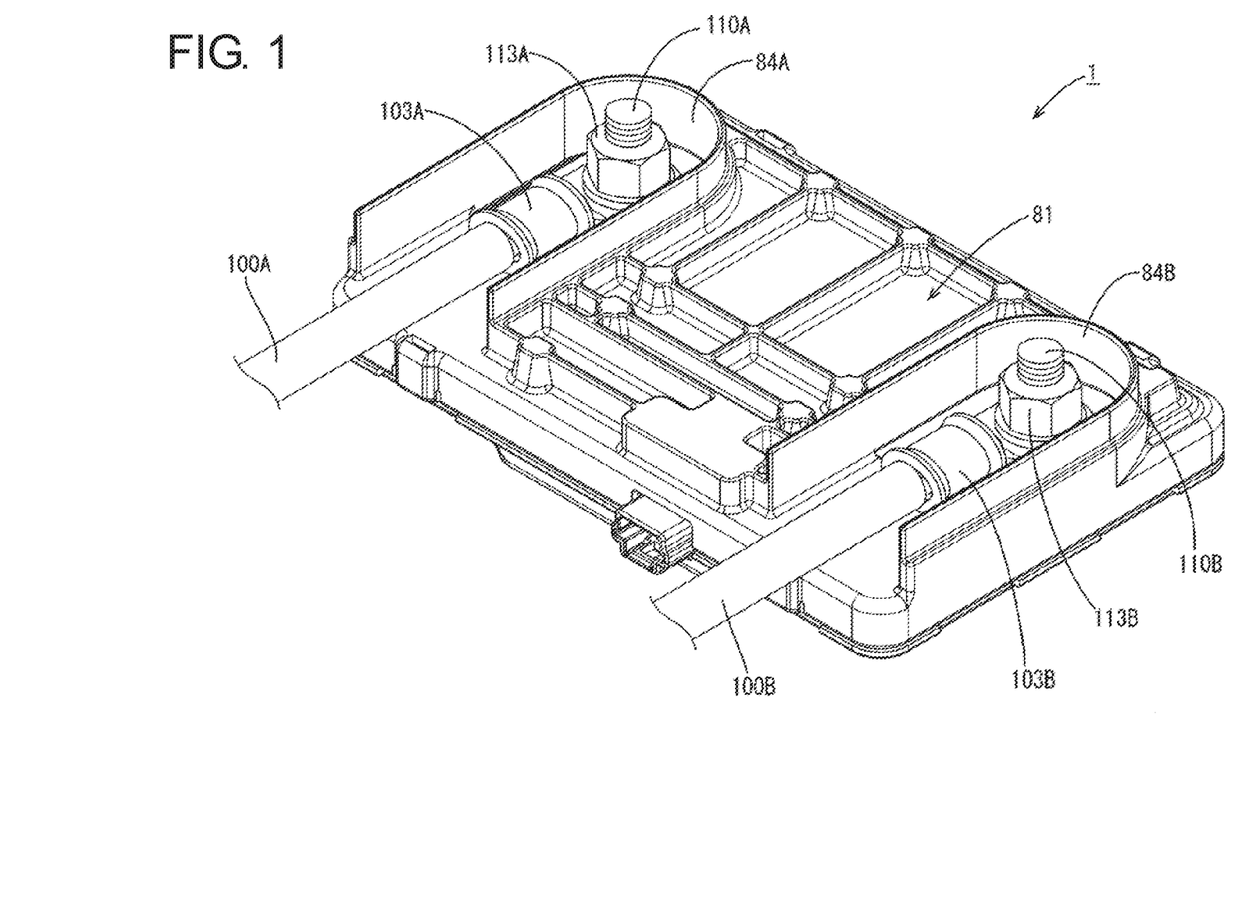
FIG. 1 is a perspective view of a switching device of an embodiment.
Figure 2:
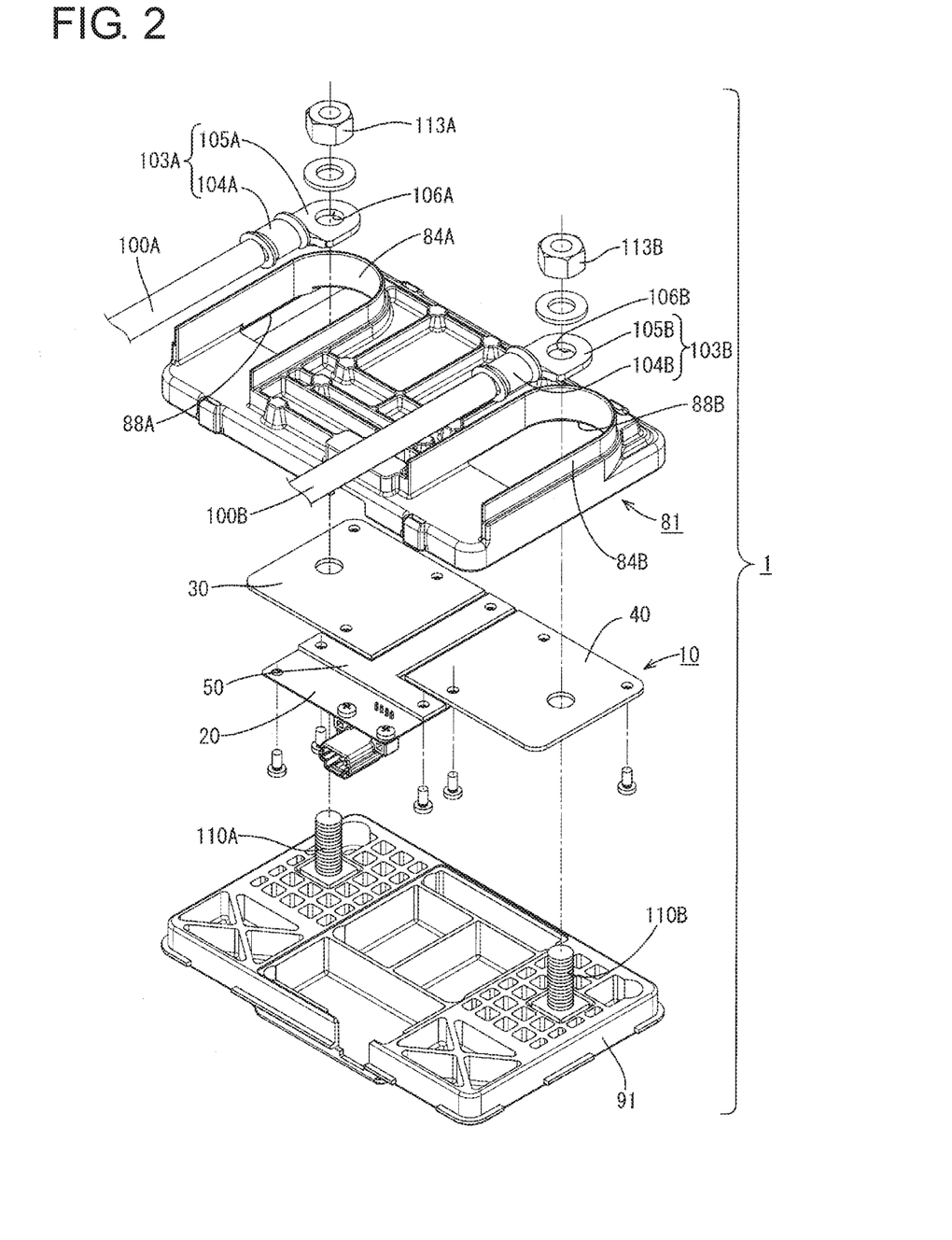
FIG. 2 is an exploded perspective view of the switching device of the embodiment.
Figure 3:
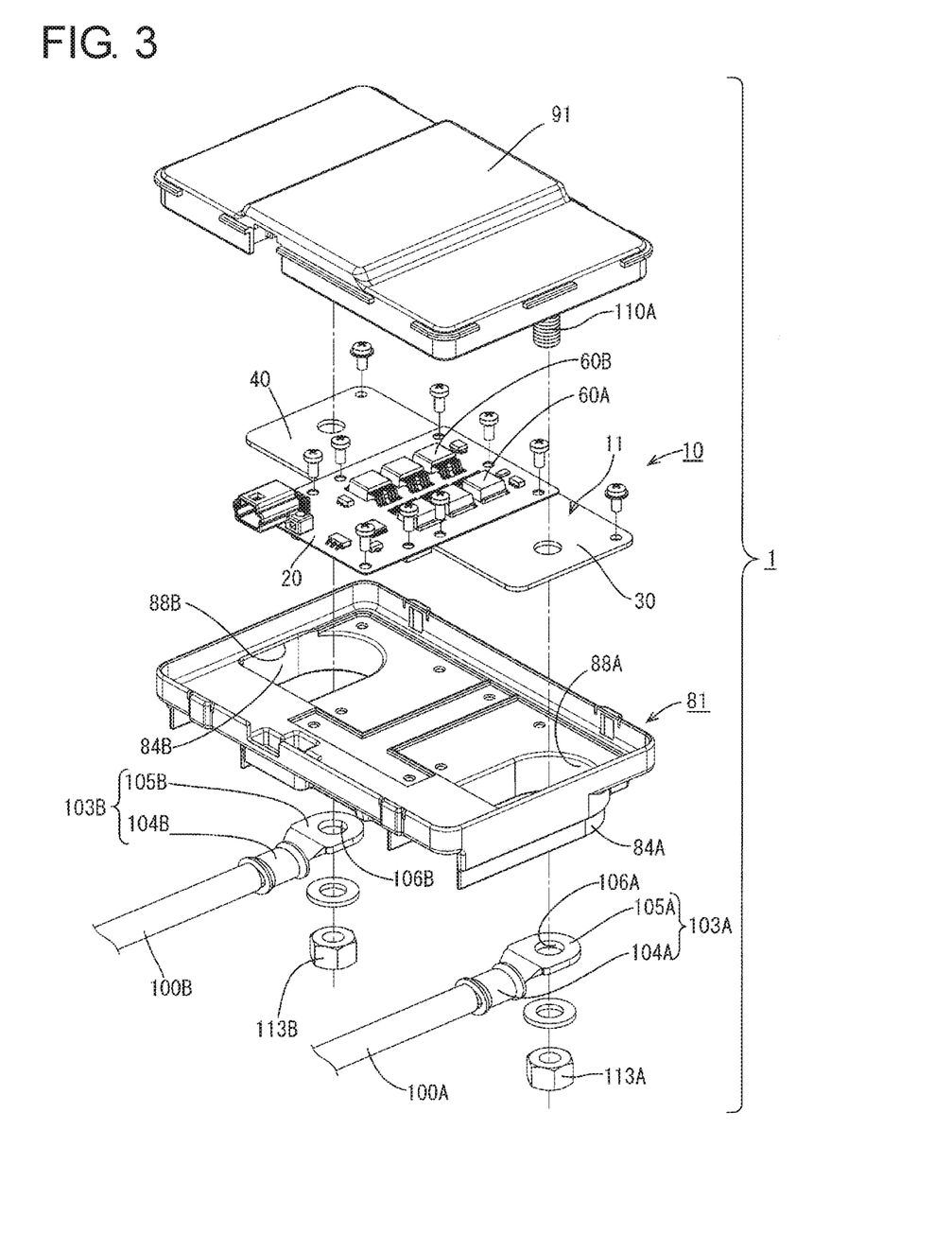
FIG. 3 is an exploded perspective view, vertically inverted from that of FIG. 2, showing the switching device of the embodiment.

As shown in FIGS. 2 and 3, the switching device 1 includes a switching board 10, an upper case 81 (corresponding to a case member), a lower case 91, stud bolts 110A, 110B (corresponding to a bolt) and nuts 113A, 113B.

The switching board 10 is a board with an input busbar 30 (corresponding to a busbar) and an output busbar 40 (corresponding to the busbar). The upper case 81 and the lower case 91 are members for covering the switching board 10.

The stud bolt 110A and the nut 113A are members for fixing a fastening terminal 103A connected to one end of a wiring harness 100A (corresponding to a wire) leading to the main battery to the input busbar 30. The stud bolt 110B and the nut 113B are members for fixing a fastening terminal 103B connected to one end of a wiring harness 100B (corresponding to the wire) leading to the auxiliary battery to the output busbar 40. The stud bolt 110A includes a shaft portion 112A formed by threading the outer peripheral surface of a metal round bar and a head portion 111A in the form of a rectangular column arranged on one end of the shaft portion 112A. The stud bolt 110B similarly includes a shaft portion 112B and a head portion 111B.

Figure 4:
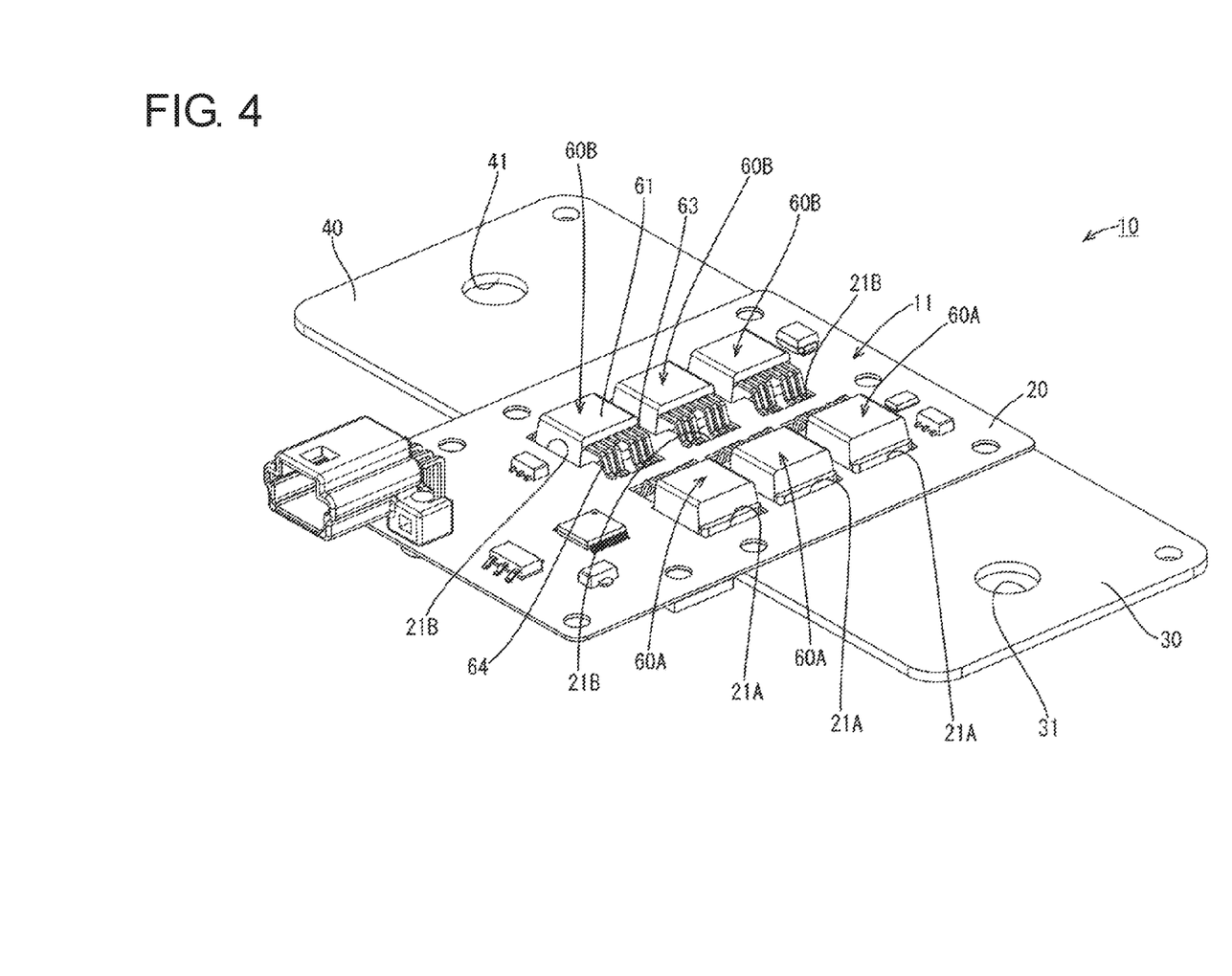
FIG. 4 is a perspective view of the switching device of the embodiment when viewed from a control circuit board side.
Figure 5:
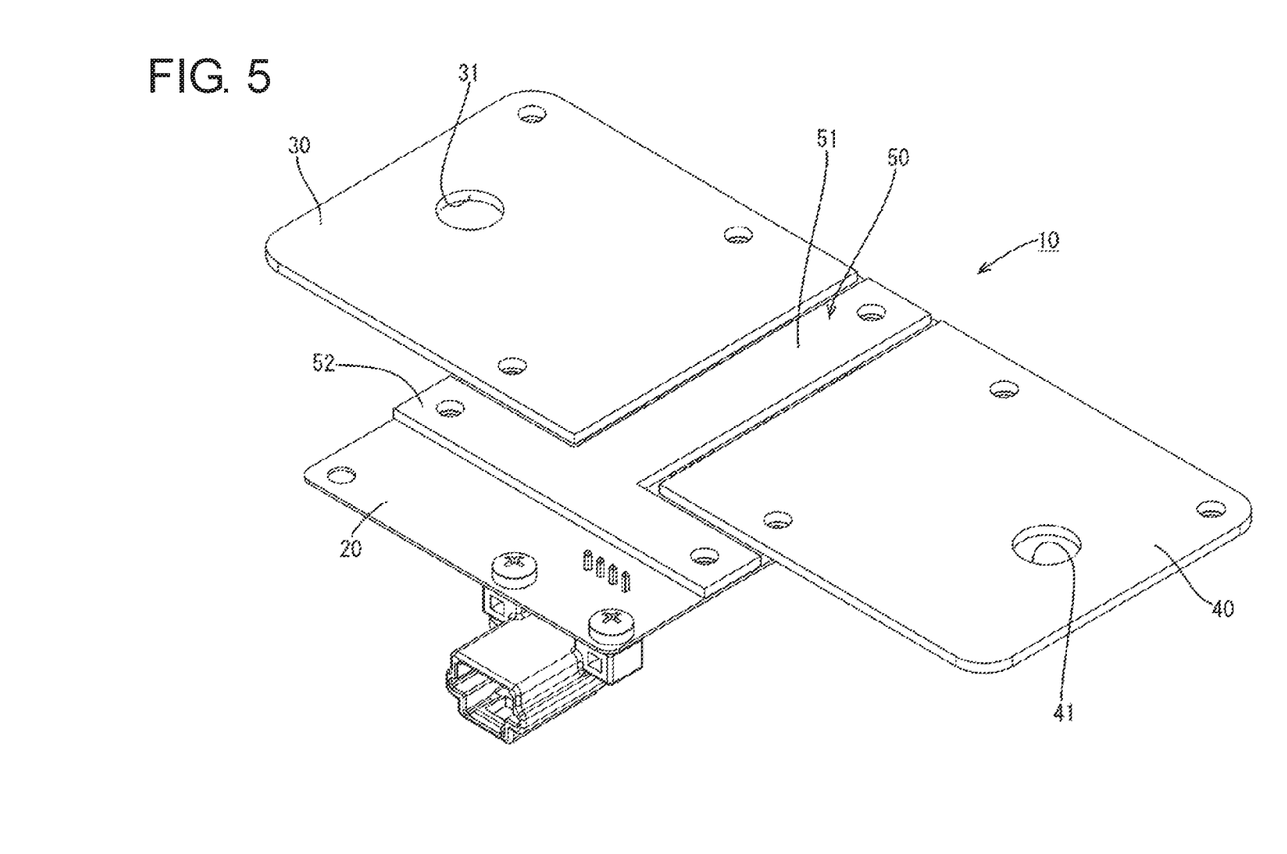
FIG. 5 is a perspective view of the switching device of the embodiment when viewed from a busbar side.

As shown in FIGS. 4 and 5, the switching board 10 includes a circuit constituent 11 and six semiconductor switching elements 60A, 60B (corresponding to a semiconductor switching element) mounted on this circuit constituent 11.

The circuit constituent 11 includes a control circuit board 20 and three busbars 30, 40 and 50 placed on this control circuit board 20 via an adhesive sheet 70.

The control circuit board 20 is such a printed board that a control circuit (not shown) made of an electrically conductive material is arranged on one surface side of an insulating plate made of a glass base material or a glass non-woven base material.

Figure 6:
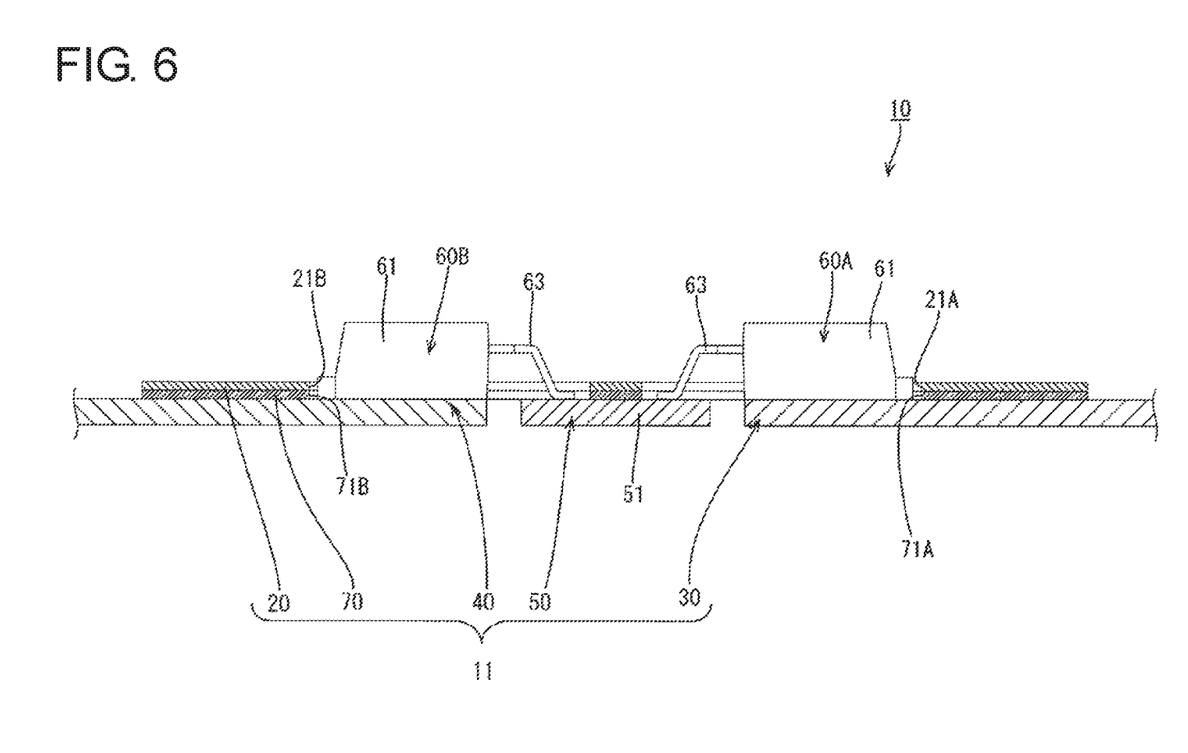
FIG. 6 is a partial enlarged section of the switching board of the embodiment.

As shown in FIG. 4, the control circuit board 20 includes six mounting windows 21A, 21B for mounting the semiconductor switching elements 60A, 60B. As shown in FIG. 6, the respective mounting windows 21A, 21B are, as a whole, rectangular openings penetrating from the surface where the control circuit 22 is arranged to an opposite surface in the control circuit board 20 and those openings are dimensioned to be one size larger than the outer shapes of the semiconductor switching elements 60A, 60B. Three of the six mounting windows 21A, 21B are first mounting windows 21A and arranged in a row. The remaining three of the six mounting windows 21A, 21B are second mounting windows 21B and arranged in a row.

As show in FIG. 6, the adhesive sheet 70 is placed on the other surface (surface opposite to the surface where the control circuit is formed) of the control circuit board 20. The adhesive sheet 70 is a rectangular sheet and includes six insertion windows 71A, 71B. The respective insertion windows 71A, 71B are, as a whole, rectangular openings penetrating from a surface where the control circuit board 20 is arranged to an opposite surface in the adhesive sheet 70. The respective first insertion windows 71A have hole edges having the same shape as those of the first mounting windows 21A and are arranged at the same positions as the first mounting windows 21A are. The respective first insertion windows 71B have hole edges having the same shape as those of the first mounting windows 21B and are arranged at the same positions as the first mounting windows 21B are.

As shown in FIG. 6, the three busbars 30, 40 and 50 are arranged side by side on the surface of the adhesive sheet 70 opposite to the one where the control circuit board 20 is arranged, and bonded to the control circuit board 20 by the adhesive sheet 70.

One of the three busbars 30, 40 and 50 is an input busbar 30 and another is an output busbar 40. As shown in FIG. 5, the input busbar 30 is a rectangular thick plate formed of an electrically conductive material (copper or copper alloy in this embodiment). The input busbar 30 is provided with a bolt insertion hole 31 for allowing the passage of the shaft portion 112A of the stud bolt 110A. The bolt insertion hole 31 is a through hole penetrating from one plate surface to the other plate surface of the input busbar 30. Similarly to the input busbar 30, the output busbar 40 is also a rectangular thick plate formed of an electrically conductive material (copper or copper alloy in this embodiment) and provided with a bolt insertion hole 41 for allowing the passage of the shaft portion 112B of the stud bolt 110B.

The input busbar 30 and the output busbar 40 are arranged while being spaced apart from each other. The input busbar 30 and the output busbar 40 are partly placed on the control circuit board 20, and parts where the bolt insertion holes 31, 41 are arranged are separated from the control circuit board 20.

The remaining one of the three busbars 30, 40 and 50 is a connection busbar 50. As shown in FIG. 5, the connection busbar 50 is a T-shaped thick plate formed of an electrically conductive material (copper or copper alloy in this embodiment). The connection busbar 50 includes a connecting portion 51 and a reinforcing portion 52. The connecting portion 51 is a long and narrow rectangular plate forming a vertical plate part of the T shape. The connecting portion 51 is arranged between the input busbar 30 and the output busbar 40 with clearances defined between the connecting portion 51 and the input and the output busbars 30, 40. The reinforcing portion 52 is a long and narrow rectangular plate forming a horizontal plate part of the T shape, and arranged perpendicularly to the connecting portion 51 on one end of the connecting portion 51. The reinforcing portion 52 is arranged with clearances defined between the reinforcing portion 52 and the input and output busbars 30, 40.

As shown in FIG. 6, a plurality of first mounting windows 21A and a plurality of first insertion windows 71A are respectively arranged at positions straddling the input busbar 30 and the connecting portion 51, and a plurality of second mounting windows 21B and a plurality of second insertion windows 71B are arranged at positions straddling the output busbar 40 and the connecting portion 51. Parts of the input busbar 30 and parts of the connecting portion 51 are exposed inside the first mounting windows 21A and the first insertion windows 71A. Parts of the output busbar 40 and parts of the connecting portion 51 are exposed inside the second mounting windows 21B and the second insertion windows 71B.

Each of the semiconductor switching elements 60A, 60B is a power MOSFET and includes a housing 61 and a drain terminal, a source terminal 63 and a gate terminal 64 provided in this housing 61 as shown in FIG. 4. Although not shown in detail, the drain terminal is arranged on the lower surface of the housing 61. Further, the source terminal 63 and the gate terminal 64 project from a side surface of the housing 61.

Three of the six semiconductor switching elements 60A, 60B are first semiconductor switching elements 60A. The remaining three of the six semiconductor switching elements 60A, 60B are second semiconductor switching elements 60B.

As shown in FIGS. 4 and 6, each of the first semiconductor switching elements 60A is arranged inside the first mounting window 21A and the first insertion window 71A. The drain terminal and the source terminal 63 are respectively connected to the part of the input busbar 30 and the part of the connecting portion 51 exposed inside the first mounting window 21A and the first insertion window 71A. The gate terminal 64 is connected to the control circuit on the control circuit board 20. Similarly, each of the second semiconductor switching elements 60B is arranged inside the second mounting window 21B and the second insertion windows 71B. The drain terminal and the source terminal 63 are respectively connected to the part of the output busbar 40 and the part of the connecting portion 51 exposed inside the second mounting window 21B and the second insertion window 71B, and the gate terminal 64 is connected to the control circuit. Connection can be carried out, for example, by soldering.

By such an arrangement, three semiconductor switching elements 60A, 60B connected in parallel are formed into one set, whereby two sets of the semiconductor switching elements 60A, 60B are connected in series. The two sets of the semiconductor switching elements 60A, 60B are arranged back to back with each other.

The fastening terminal 103A is a terminal connected to one end of the wiring harness 100A leading to the main battery, and fixed to the input busbar 30 using the stud bolt 110A and the nut 113A.

The wiring harness 100A includes a core 101A and an insulation coating 102A covering the outer periphery of the core 101A. The fastening terminal 103A is made of metal and includes a barrel portion 104A to be crimped to the core 101A exposed from the insulation coating 102A at one end of the wiring harness 100A and a connecting portion 105A connected to one end of the barrel portion 104A and having a bolt insertion hole 106A.

The fastening terminal 103B is a terminal connected to one end of the wiring harness 100B leading to the auxiliary battery, and fixed to the input busbar 30 using the stud bolt 110B and the nut 113B.

Similar to the wiring harness 100A, the wiring harness 100B includes a core 101B and an insulation coating 102B. Similarly to the fastening terminal 103A, the fastening terminal 103B includes a barrel portion 104B and a connecting portion 105B having a bolt insertion hole 106B.

The upper case 81 is a case made of synthetic resin and configured to cover a surface of the switching board 10 where the busbars 30, 40 and 50 are arranged. As shown in FIGS. 2 and 3, the upper case 81 is a tray-like case having an outer shape one size larger than that of the switching board 10 and includes a rectangular ceiling plate 82 arranged in parallel to the switching board 10 and a side plate 83 extending toward the switching board 10 from the peripheral edge of this ceiling plate 82.

Figure 7:
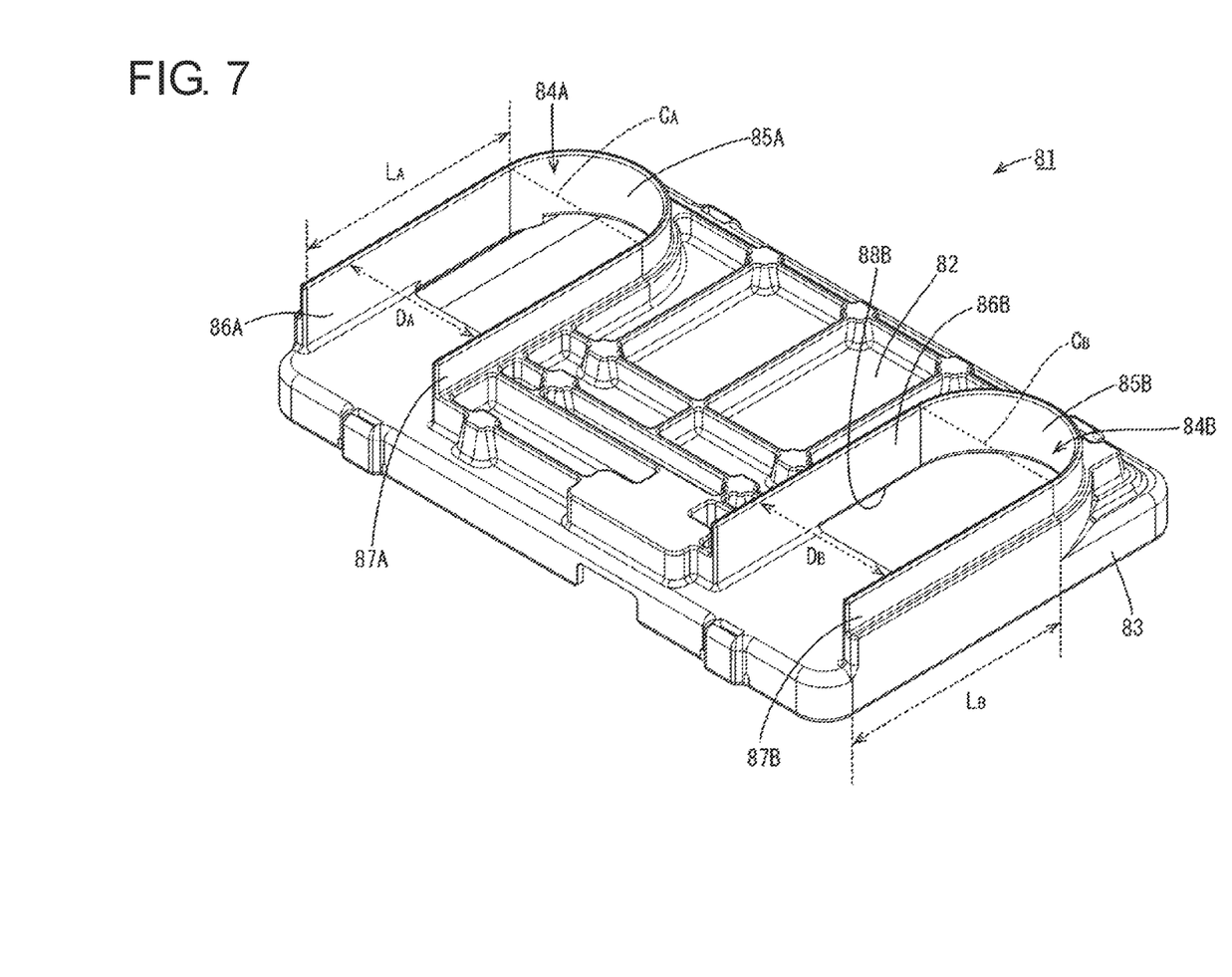
FIG. 7 is a perspective view of an upper case of the embodiment.
Figure 8:
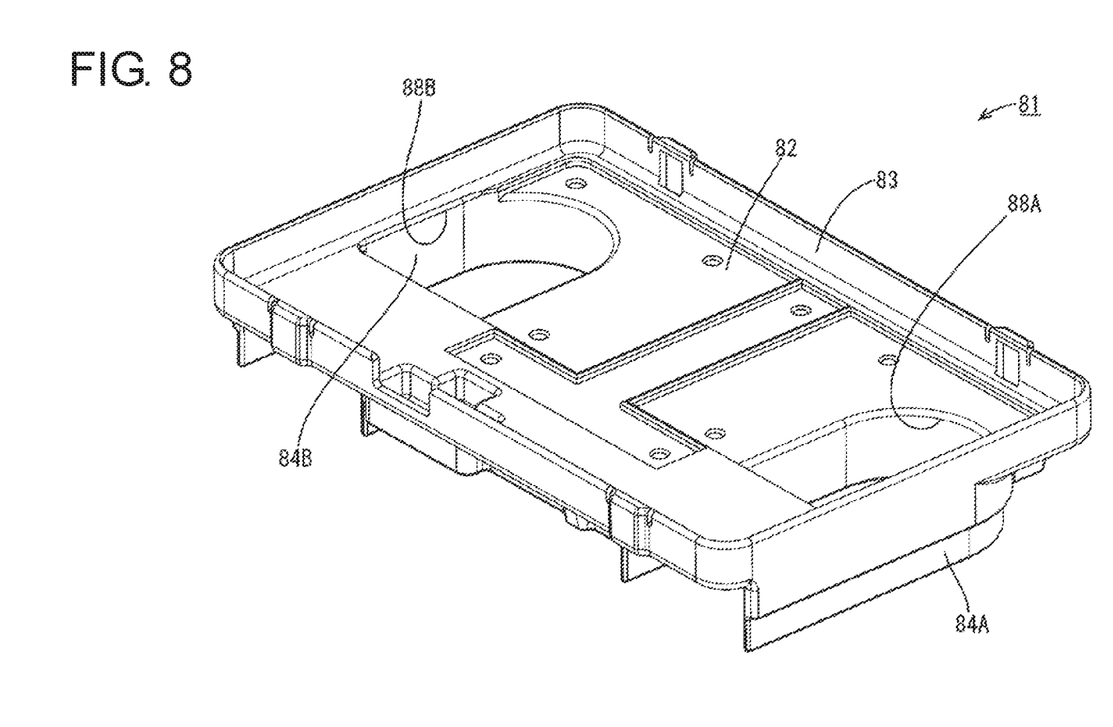
FIG. 8 is a perspective view, vertically inverted from that of FIG. 7, showing the upper case of the embodiment.

As shown in FIGS. 7 and 8, the upper case 81 includes two auxiliary walls 84A, 84B and two fastening windows 88A, 88B. Each auxiliary wall 84A, 84B is a wall extending outward (direction opposite to the one toward the switching board 10) from the ceiling plate 82. Each auxiliary wall 84A, 84B stands perpendicularly to the ceiling plate 82. One 84A of the two auxiliary walls 84A, 84B is arranged around the arranged position of the bolt insertion hole 31 on the switching board 10, and the other auxiliary wall 84B is arranged around the arranged position of the bolt insertion hole 41 on the switching board 10.

The one auxiliary wall 84A includes a guide wall 85A and a pair of restriction walls 86A, 87A connected to the guide wall 85A.

The guide wall 85A is a wall having a semicircular cross-section and a radius of the semicircle is slightly larger than an outer diameter of a tool (impact wrench) for fastening the nut 113A. The guide wall 85A is arranged around the arranged position of the bolt insertion hole 31 and a center position of the semicircle coincides with a center position of a circle formed by the hole edge of the bolt insertion hole 31.

The pair of restriction walls 86A, 87A are respectively walls extending straight from opposite end edges of the semicircular guide wall 85A. As shown in FIG. 7, each restriction wall 86A, 87A extends perpendicularly to a line (chord $C_A$) connecting opposite ends of the semicircular guide wall 85A. The two restriction walls 86A, 87A are arranged in parallel to each other and a distance $D_A$ between the two restriction walls 86A, 87A is equal to a length of the line (chord $C_A$) connecting the opposite ends of the semicircular guide wall 85A. Out of the two restriction walls 86A, 87A, the restriction wall 86A on a side distant from the other auxiliary wall 84B is arranged and connected to the side plate 83.

A length $L_A$ of the restriction wall 86A defined by a distance from an end edge connected to the guide wall 85A to an opposite end edge is set to be able to avoid the contact of the barrel portion 104A with the restriction wall 86A when the fastening terminal 103A is rotated until the wiring harness 100A comes into contact with the opposite end edge of the restriction wall 86A. The same holds also for a length of the restriction wall 87A.

The other auxiliary wall 84B includes a guide wall 85B and a pair of restriction walls 86B, 87B connected to the guide wall 85B. The shapes of the guide wall 85B and the restriction wall 86B are similar to those of the guide wall 85A and the restriction walls 86A, 87A. The guide wall 85B is arranged around the area where the bolt insertion hole 41 is arranged and a center position of the semicircle coincides with a center position of a circle formed by the hole edge of the bolt insertion hole 41. Out of the two restriction walls 86B, 87B, the restriction wall 87B on a side distant from the one auxiliary wall 84A is arranged and connected to the side plate 83.

As shown in FIG. 7, a distance $D_B$ between the two restriction walls 86B, 87B is equal to a length of the line (chord $C_B$) connecting opposite ends of the semicircular guide wall 85B. A length $L_B$ of the restriction wall 87B defined by a distance from an end edge connected to the guide wall 85B to an opposite end edge is set to be able to avoid the contact of the barrel portion 104B with the restriction wall 87B when the fastening terminal 103B is rotated until the wiring harness 100B comes into contact with the opposite end edge of the restriction wall 87B. The same holds also for a length of the restriction wall 86B.

One fastening window 88A of the two fastening windows 88A, 88B is provided at an inner side of the auxiliary wall 84A. The fastening window 88A is arranged in an area surrounded by the guide wall 85A and parts of the two restriction walls 86B, 87B proximate to the guide wall 85B. Similarly, the other fastening window 88B is provided at an inner side of the auxiliary wall 84B and arranged in an area surrounded by the guide wall 85B and parts of the two restriction walls 86B, 87B proximate to the guide wall 85B. Each fastening window 88A, 88B is a through hole penetrating from one surface to the other surface of the ceiling plate 82.

The lower case 91 is a case made of synthetic resin and configured to cover a surface of the switching board 10 where the control circuit board 20 is arranged. As shown in FIGS. 2 and 3, the lower case 91 is a thick plate having substantially the same outer shape as the upper case 81 and arranged in parallel to the switching board 10.

Figure 9:
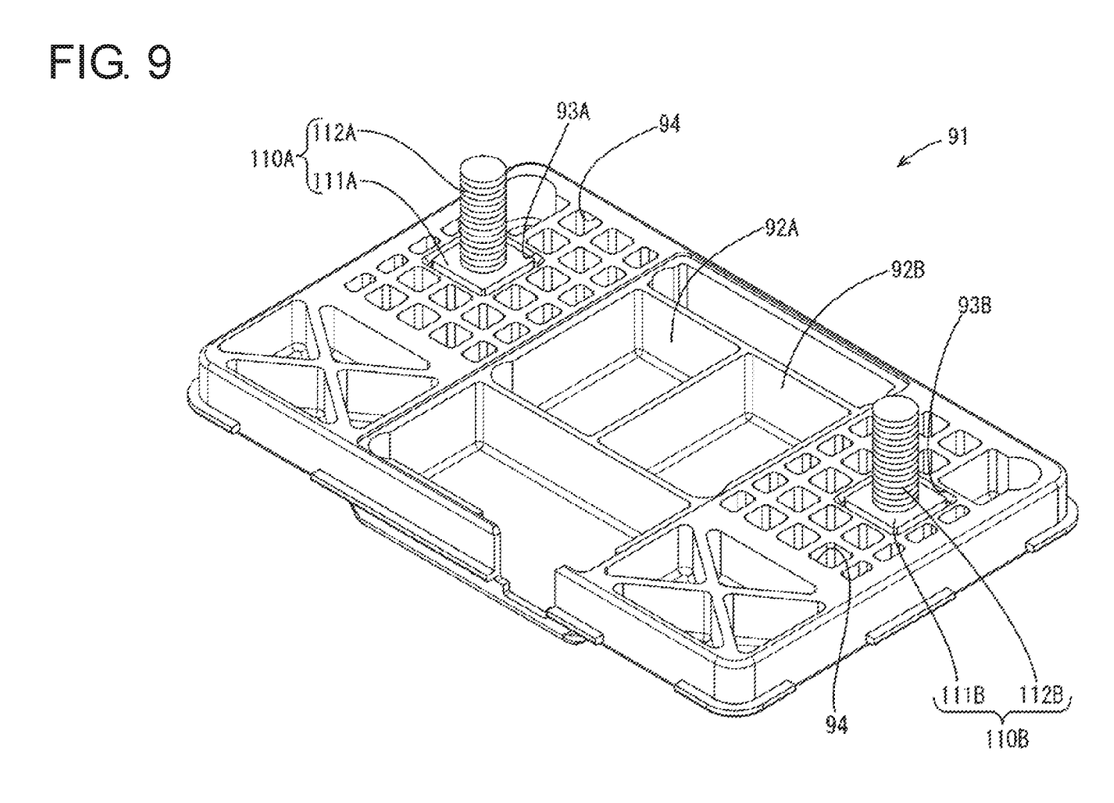
FIG. 9 is a perspective view of a lower case of the embodiment.
Figure 10:
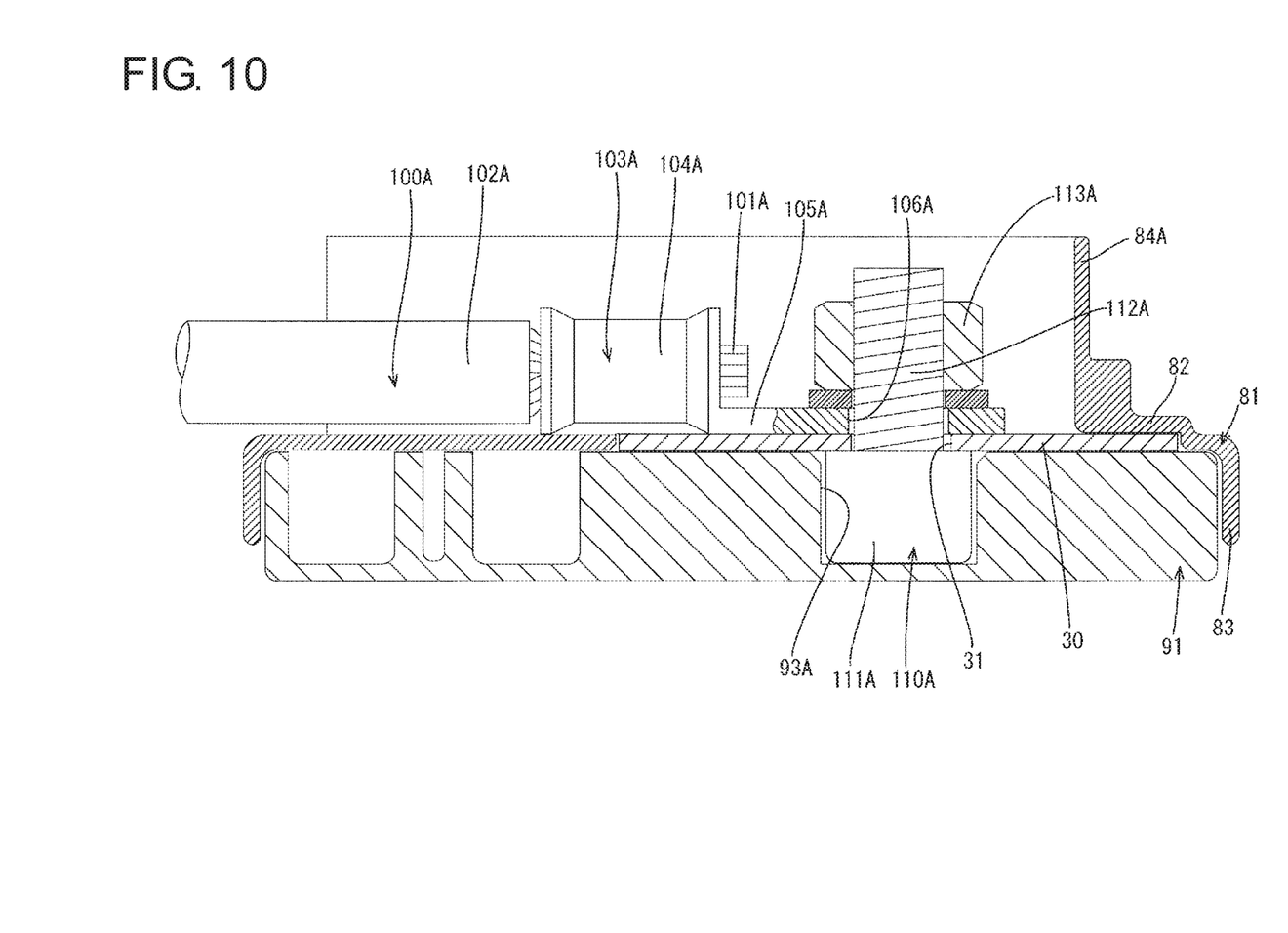
FIG. 10 is a side view in section of the switching device of the embodiment.

As shown in FIG. 9, the lower case 91 includes two element accommodating portions 92A, 92B, two bolt accommodating portions 93A, 93B and a plurality of lightening holes 94.

The two element accommodating portions 92A, 92B are recesses for accommodating the semiconductor switching elements 60A, 60B inside and recessed in a direction away from the switching board 10 from a surface of the lower case 91 facing the switching board 10. The two element accommodating portions 92A, 92B are arranged side by side substantially at a central position on the surface of the lower case 91 facing the switching board 10. That is, the two element accommodating portions 92A, 92B are arranged in an area where the semiconductor switching elements 60A, 60B are to be arranged.

One 93A of the two bolt accommodating portions 93A, 93B is a recess for accommodating the head portion 111A of the stud bolt 110A inside and recessed in the direction away from the switching board 10 from the surface of the lower case 91 facing the switching board 10. The hole edge of the bolt accommodating portion 93A has a rectangular outer shape slightly larger than that of the head portion 111A. The other bolt accommodating portion 93B is a recess for accommodating the head portion 111B of the stud bolt 110B inside and shaped similarly to the bolt accommodating portion 93A. Each of the two bolt accommodating portions 93A, 93B is arranged lateral to the corresponding one of the two element accommodating portions 92A, 92B. That is, the one bolt accommodating portion 93A is arranged in an area where the bolt insertion hole 31 is arranged and the other bolt accommodating portion 93B is arranged in an area where the bolt insertion hole 41 is arranged.

The plurality of lightening holes 94 are arranged around each of the two bolt accommodating portions 93A, 93B. Each lightening hole 94 is a recess recessed in the direction away from the switching board 10 from the surface of the lower case 91 facing the switching board 10. The hole edge of each lightening hole 94 has a rectangular outer shape smaller than those of the hole edges of the bolt accommodating portions 93A, 94A. The plurality of lightening holes 94 are provided to alleviate a stress applied to the lower case 91 via the stud bolt 110A, 110B when the nut 113A, 113B is fastened to the stud bolt 110A, 110B.

A procedure of assembling the switching device 1 configured as described above and mounting the fastening terminals 103A, 103B is described below.

First, the stud bolts 110A, 110B are assembled with the lower case 91. The stud bolts 110A, 110B are respectively arranged such that the head portions 111A, 111B are accommodated in the bolt accommodating portions 93A, 93B and the shaft portions 112A, 112B project perpendicularly from the plate surface of the lower case 91.

Further, the upper case 81 is placed on the switching board 10. The switching board 10 is arranged such that a part of the input busbar 30 around the part where the bolt insertion hole 31 is arranged is exposed inside the fastening window 88A and a part of the output busbar 40 around the part where the bolt insertion hole 41 is arranged is exposed inside the fastening window 88B.

Subsequently, the lower case 91 and the upper case 81 are assembled. The shaft portion 112A of the stud bolt 110A is inserted through the bolt insertion hole 31 and the fastening window 88A and arranged at the inner side of the auxiliary wall 84A. Further, the shaft portion 112B of the stud bolt 110B is inserted through the bolt insertion hole 41 and the fastening window 88B and arranged at the inner side of the auxiliary wall 84B.

Subsequently, the wiring harness 100A leading to the main battery is arranged inside 84A, the shaft portion 112A of the stud bolt 110A is inserted into the bolt insertion hole 106A and the connecting portion 105A is placed on the input busbar 30. Similarly, the wiring harness 100B leading to the auxiliary battery is arranged inside 84B, the shaft portion 112B of the stud bolt 110B is inserted into the bolt insertion hole 106B and the connecting portion 105B is placed on the output busbar 40.

Subsequently, the nut 113A is held by the impact wrench (not shown) and moved to a fastening position to the stud bolt 110A along the guide wall 85A. Then, the impact wrench is rotated to fasten and fix the nut 113A to the shaft portion 112A. Similarly, the stud bolt 110B is also fastened and fixed to the stud bolt 110B.

According to this embodiment, the guide wall 85A, 85B guides the impact wrench in arranging the impact wrench holding the nut 113A, 113B at the fastening position to the stud bolt 110A, 110B. Thus, the nut 113A, 113B can be easily positioned with respect to the stud bolt 110A, 110B. Further, even if the nut 113A, 113B is dropped from the impact wrench, the nut 113A, 113B stays in a space surrounded by the auxiliary wall 84A, 84B, wherefore a loss of the nut 113A, 113B is avoided.

Figure 11:
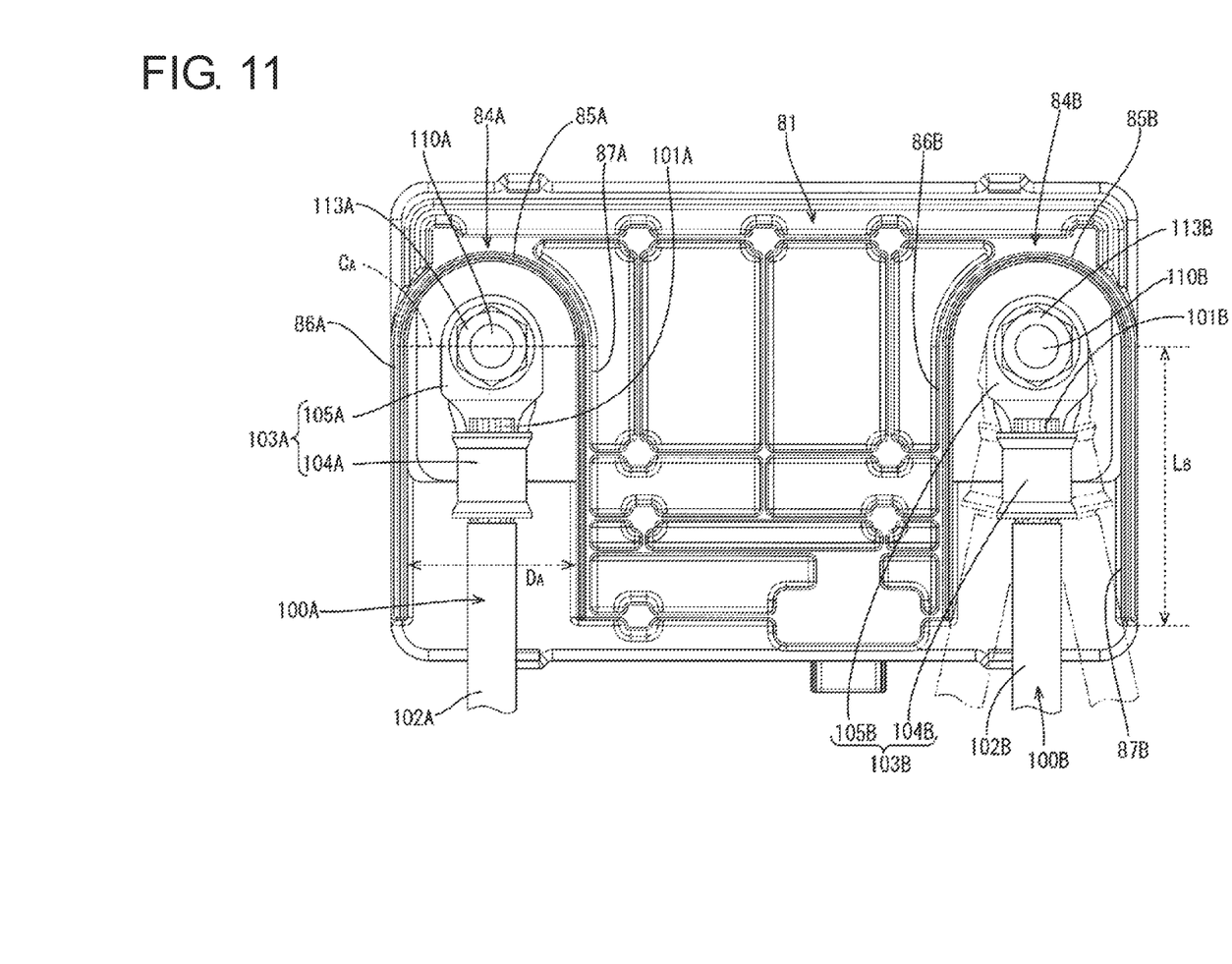
FIG. 11 is a plan view showing a state where a fastening terminal fixed to the switching device of the embodiment is rotated.

Further, if the fastening terminal 103B rotates according to the rotation of the nut 113B as shown in FIG. 11, the wiring harness 100A comes into contact with the restriction wall 86B or 87B to restrict any further rotation of the fastening terminal 103B. The same holds also for the fastening terminal 103B. Thus, an operation of pressing the fastening terminal 103A, 103B with a tool such as a pair of pliers is not necessary in performing a fastening operation.

Furthermore, as shown in FIG. 11, the length $L_B$ of the restriction wall 87B defined by the distance from the end edge connected to the guide wall 85B to the opposite end edge is set to be able to prevent the contact of the barrel portion 104B with the restriction wall 86B when the fastening terminal 103B is rotated until the wiring harness 100B comes into contact with the opposite end edge of the restriction wall 86B. That is, when the fastening terminal 103B rotates according to the rotation of the nut 103B, the wiring harness 100B comes into contact with the restriction wall 86B earlier than the fastening terminal 103B and any further rotation of the fastening terminal 103B is restricted. Thus, the damage of the fastening terminal 103B due to the contact with the restriction wall 86B can be avoided. The same holds also for the other restriction walls 86A, 87A and 86B.

In addition, in the auxiliary wall 84A, the distance $D_A$ between the two restriction walls 86A, 87A is equal to the length of the line (chord $C_A$) connecting the opposite ends of the semicircular guide wall 85A. According to this configuration, a sufficient distance is ensured between the pair of restriction walls 86A, 87A in a range where the rotation of the fastening terminal 103A can be suppressed. That is, a sufficient space is ensured to arrange the wiring harness 100A in the space surrounded by the auxiliary wall 84A. The same holds also for the auxiliary wall 84B. In this way, operability in fixing the fastening terminals 103A, 103B can be improved.

The invention claimed is:

1. A switching device, comprising:
   a switching board including a circuit constituent having a control circuit board and a busbar arranged on one surface of the control circuit board, and a switching element mounted on the circuit constituent;
   a case member arranged to be placed on the surface of the switching board where the busbar is arranged;
   a bolt arranged to penetrate through the busbar and the case member; and
   a nut for fixing a fastening terminal the busbar by being threadably engaged with the bolt, a wire mounted to an end of the fastening terminal, wherein:
   the case member includes a guide wall arranged around the bolt and configured to guide a movement of a tool for fastening the nut to the bolt to a fastening position to the bolt and a restriction wall connected to the guide wall, the restriction wall having a length greater than a length of the fastening terminal so as to restrict the rotation of the fastening terminal by coming into contact with the wire; and
   prevent the fastening terminal from contacting the restriction wall by placing the wire into contact with the restriction wall.

2. A switching device according to claim 1, wherein:
   the guide wall is a wall having a semicircular cross-section;
   a pair of the restriction walls are respectively connected to opposite end edges of the semicircular guide wall;
   the pair of restriction walls are arranged in parallel to each other and a distance between the pair of restriction walls is equal to a length of a line connecting opposite ends of the semicircular guide wall.

* * * * *